(12) United States Patent
Chu et al.

(10) Patent No.: US 11,956,888 B2
(45) Date of Patent: Apr. 9, 2024

(54) ELECTRONIC DEVICE AND GROUNDING ASSEMBLY THEREOF

(71) Applicant: Delta Electronics, Inc., Taoyuan (TW)

(72) Inventors: Chia-Hsien Chu, Taoyuan (TW); Yi-Hua Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 65 days.

(21) Appl. No.: 17/398,922

(22) Filed: Aug. 10, 2021

(65) Prior Publication Data

US 2022/0248528 A1 Aug. 4, 2022

(30) Foreign Application Priority Data

Feb. 2, 2021 (CN) .......................... 202110144767.1

(51) Int. Cl.
*H05K 1/02* (2006.01)
*H05K 3/30* (2006.01)
*H05K 5/00* (2006.01)

(52) U.S. Cl.
CPC ........... *H05K 1/0215* (2013.01); *H05K 3/301* (2013.01); *H05K 5/006* (2013.01)

(58) Field of Classification Search
CPC ...... H05K 1/0215; H05K 3/301; H05K 5/006; H05K 9/0039; H05K 2201/10409; H05K 5/0217; H05K 5/0247; H05K 7/14; H01R 4/64
See application file for complete search history.

(56) References Cited

U.S. PATENT DOCUMENTS 5,166,864 A * 11/1992 Chitwood ............ H05K 1/0218
361/720
5,519,169 A * 5/1996 Garrett ................. H05K 9/0039
174/371

(Continued)

FOREIGN PATENT DOCUMENTS

CN 101494324 A 7/2009
CN 101770264 A 7/2010
(Continued)

*Primary Examiner* — Abhishek M Rathod
(74) *Attorney, Agent, or Firm* — KIRTON McCONKIE; Evan R. Witt (57) ABSTRACT

An electronic device includes a casing, a circuit board and a grounding assembly. The circuit board has a first surface and a second surface, wherein an input terminal and an output terminal are disposed on the second surface. The grounding assembly comprises a conducting terminal, a first grounding element and a second grounding element. The conducting terminal is disposed on the first surface of the circuit board, and the first grounding element is disposed adjacent to the conducting terminal. The first grounding element penetrates the circuit board and electrically couples with the conducting terminal and the casing, and the second grounding element correspondingly penetrates the circuit board and the conducting element, so that a first portion of the second grounding element electrically couples with the input terminal and the output terminal of the circuit board, and a second portion of the second grounding element electrically couples with the conducting terminal.

6 Claims, 7 Drawing Sheets

(56) References Cited

U.S. PATENT DOCUMENTS

| | | | | |
|---|---|---|---|---|
| 5,763,830 | A * | 6/1998 | Hsueh | H02G 15/085 |
| | | | | 361/753 |
| 5,991,164 | A * | 11/1999 | Saito | H01T 4/08 |
| | | | | 361/752 |
| 6,019,614 | A * | 2/2000 | Baur | H05K 9/0039 |
| | | | | 439/92 |
| 6,186,800 | B1 * | 2/2001 | Klein | H05K 9/0039 |
| | | | | 439/95 |
| 6,188,019 | B1 * | 2/2001 | Baur | H05K 9/0039 |
| | | | | 361/752 |
| 6,319,018 | B1 * | 11/2001 | Daoud | H05K 1/0215 |
| | | | | 439/65 |
| 9,370,091 | B2 * | 6/2016 | Kinoshita | H01R 12/55 |
| 10,034,365 | B2 * | 7/2018 | Yang | G06F 1/184 |
| 10,172,263 | B1 * | 1/2019 | Martin | H01R 4/26 |
| 10,496,137 | B1 * | 12/2019 | Dickenson | H05K 9/0039 |
| 10,802,547 | B2 * | 10/2020 | Dickenson | H05K 1/0215 |
| 10,959,343 | B2 * | 3/2021 | Cayou | H05K 5/0247 |
| 2004/0090748 | A1 * | 5/2004 | Kishimoto | H05K 9/0039 |
| | | | | 361/719 |
| 2006/0067062 | A1 * | 3/2006 | Ishimoto | H05K 3/325 |
| | | | | 361/753 |
| 2007/0133187 | A1 * | 6/2007 | Lin | H05K 9/0039 |
| | | | | 361/759 |
| 2009/0219703 | A1 * | 9/2009 | Ishii | H05K 1/0215 |
| | | | | 174/262 |
| 2011/0155445 | A1 * | 6/2011 | Kwon | H05K 9/0031 |
| | | | | 174/384 |
| 2011/0242721 | A1 * | 10/2011 | Chen | H05K 1/0254 |
| | | | | 361/131 |
| 2013/0343015 | A1 * | 12/2013 | Malek | G06F 1/183 |
| | | | | 361/752 |
| 2014/0177181 | A1 * | 6/2014 | Malek | H05K 9/0028 |
| | | | | 361/752 |
| 2014/0211432 | A1 * | 7/2014 | Lozano | H05K 7/142 |
| | | | | 361/759 |
| 2016/0359316 | A1 * | 12/2016 | Yang | H02H 9/04 |
| 2017/0171960 | A1 * | 6/2017 | Yang | H05K 1/0215 |
| 2017/0188450 | A1 * | 6/2017 | Svensson | H05K 1/0215 |
| 2017/0213479 | A1 * | 7/2017 | Li | G09B 19/00 |
| 2019/0235588 | A1 * | 8/2019 | Langner | G06F 1/184 |
| 2020/0097049 | A1 * | 3/2020 | Dickenson | G06F 1/1658 |

FOREIGN PATENT DOCUMENTS

| | | |
|---|---|---|
| CN | 202773185 U | 3/2013 |
| CN | 201438359 A | 10/2014 |
| CN | 205005341 U | 1/2016 |
| CN | 106301004 A | 1/2017 |
| JP | 2007207432 A | 8/2007 |
| TW | 201438359 A | 10/2014 |
| TW | I563787 B | 12/2016 |

* cited by examiner

ELECTRONIC DEVICE AND GROUNDING ASSEMBLY THEREOF

CROSS-REFERENCE TO RELATED APPLICATION

This application claims priority to China Patent Application No. 202110144767.1, filed on Feb. 2, 2021. The entire contents of the above-mentioned applications are incorporated herein by reference for all purposes.

FIELD OF THE INVENTION

The present disclosure relates to a grounding assembly, and more particularly to an electronic device and grounding assembly thereof for utilizing in a closed electronic device and can be conducted a high potential test after machine assembly.

BACKGROUND OF THE INVENTION

With the rapid development of technology, there are various electronic products developed day by day, these electronic products occupy most of people's daily life. However, in the various electronic products, it is necessary to use the power supply device to convert the AC power into a DC power for the operation of the electronic products.

Especially in the design of the outdoor electronic products, in order to avoid high-voltage current surges caused by lightning strikes to damage the power supply device or electronic components inside the outdoor electronic products, it generally conduct a High potential (Hi-pot test to the power supply device during the manufacturing process, so as to ensure that the power supply device complies the safety regulations and to avoid damage to the internal electronic components by the high potential high-voltage current surges caused by lightning strike.

Figure 1:
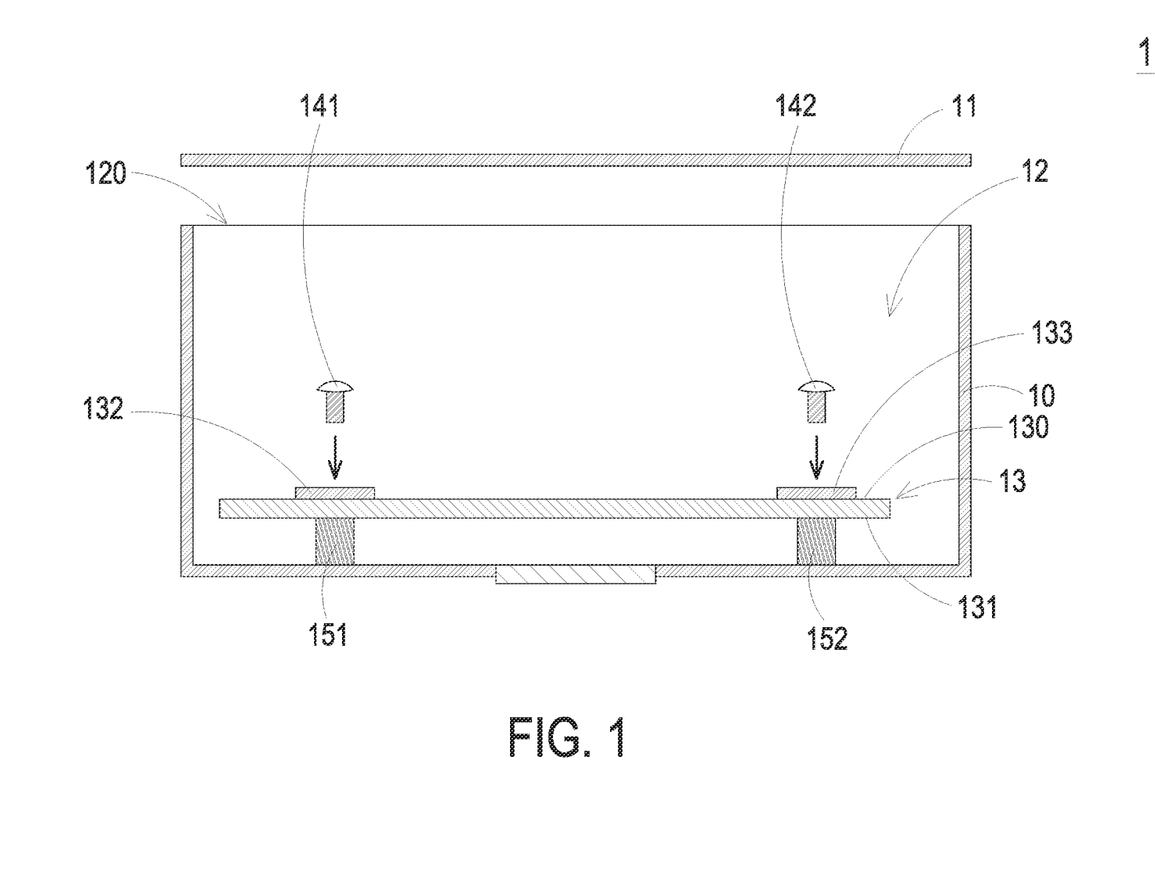
FIG. 1 is a schematic cross-sectional view illustrating a conventional power supply device.

Please refer to FIG. 1. The conventional power supply device 1 has a casing 10 and an upper cover 11, the casing 10 has a receiving space 12 and an opening 120. A circuit board 13 is correspondingly disposed within the receiving space 12 of the casing 10 through the opening 120, and locked on a bottom plate by two studs 151 and 152. In this conventional power supply device 1, the circuit board 13 has a first surface 130 and a second surface 131, wherein an input terminal 132 and an output terminal 133 are disposed on the first surface 130, and the positions of the input terminal 132 and the output terminal 133 are respectively in correspondence to the studs 151 and 152 locking on the second surface 131 of the circuit board 13. In general, after the circuit board 13 is locked on the casing 10, a Hi-pot test can be conducted to the conventional power supply device 1. After the Hi-pot test is finished, two grounding screws 141 and 142 are locked downwardly into the studs 151 and 152 by respectively penetrating the input terminal 132 and the output terminal 133 of the first surface 130, so as to reach the grounding protection to the input terminal 132 and the output terminal 133. Finally, the upper cover 11 is respectively covered on the opening 120, and the assembly process of the conventional power supply device 1 is finished.

In this assembly process, the entire machine is capped only after the Hi-pot test and the grounding process are over. However, it is difficult to ensure the stability and safety of the products during the last two processes. Moreover, since the assembly process is complicated, it leads waste of production time, and the product quality is also hard to be ensured.

Therefore, there is a need of providing an electronic device and grounding assembly thereof to obviate the drawbacks encountered from the prior arts.

SUMMARY OF THE INVENTION

It is an object of the present disclosure to provide an electronic device. The electronic device includes a grounding assembly. By the structurally design of the grounding assembly, the grounding protection procedure can be performed after machine assembly of the electronic device and Hi-pot test under the situation without open the cover of the electronic device. Consequently, the safety and stability of the electronic device can be ensured.

It is another object of the present disclosure to provide a grounding assembly. The grounding assembly includes a conducting terminal, a first grounding element and a second grounding element. The conducting terminal and the first grounding element are first disposed on and electrically couple with the circuit board. After the circuit board and other electronic elements are disposed within the electronic device, and the Hi-pot test of the electronic device is also finished, the second grounding element sequentially penetrates through the first through hole of the casing, the circuit board and the conducting terminal, and locks on and electrically couples with the circuit board and the conducting terminal. Consequently, the grounding protection procedure is complete. Consequently, it can reach the efficacy of simple structures, easy and fast assembly, so as to solve the problems of complicated assembly process, waste of production time and cost, and difficulty in ensuring product quality in the prior art.

In accordance with an aspect of the present disclosure, there is provided an electronic device including a casing, a circuit board and a grounding assembly. The casing has a receiving space. The circuit board is disposed in the receiving space and has a first surface and a second surface, wherein an input terminal and an output terminal are disposed on the second surface. The grounding assembly comprises a conducting terminal, a first grounding element and a second grounding element. The conducting terminal is disposed on the first surface of the circuit board, and the first grounding element is disposed adjacent to the conducting terminal. The first grounding element penetrates the circuit board and electrically couples with the conducting terminal and the casing, and the second grounding element correspondingly penetrates the circuit board and the conducting element. Consequently, a first portion of the second grounding element electrically couples with the input terminal and the output terminal of the circuit board, and a second portion of the second grounding element electrically couples with the conducting terminal.

In an embodiment, the casing has a bottom plate, and the bottom plate has a first through hole, wherein the second grounding element penetrates the first through hole to lock with the circuit board.

In an embodiment, the electronic device further comprises a valve, and the valve seals the first through hole of the bottom plate.

In an embodiment, the conducting terminal comprises a second through hole for the second portion of the second grounding element to penetrate within.

In an embodiment, the conducting terminal is a rectangle hollow structure and comprises a plurality of legs, the plurality of legs penetrate the circuit board, so as to fix the conducting terminal on the first surface of the circuit board.

In an embodiment, the first grounding element comprises a third portion, and the third portion electrically couples with the conducting terminal through a trace of the first surface of the circuit board.

In an embodiment, the electronic device comprises a fixing element, the fixing element is disposed under the second surface of the circuit board, when the first grounding element penetrates the circuit board, a fourth portion of first grounding element correspondingly is locked with the fixing element.

In accordance with another aspect of the present disclosure, there is provided a grounding assembly. The grounding assembly is utilized in an electronic device. The electronic device comprises a casing and a circuit board. The grounding assembly comprises a conducting terminal, a first grounding element and a second grounding element. The conducting terminal is disposed on the first surface of the circuit board. The first grounding element is disposed adjacent to the conducting terminal and penetrates the circuit board, and electrically couples with the conducting terminal and the casing. The second grounding element correspondingly penetrates the circuit board and the conducting element. Consequently, a first portion of the second grounding element electrically couples with the input terminal and the output terminal of the circuit board, and a second portion of the second grounding element electrically couples with the conducting terminal.

In an embodiment, the conducting terminal comprises a second through hole for the second portion of the second grounding element to penetrate within.

In an embodiment, the conducting terminal is a rectangle hollow structure and comprises a plurality of legs, the plurality of legs penetrate the circuit board, so as to fix the conducting terminal on the first surface of the circuit board.

In an embodiment, the first grounding element comprises a third portion, and the third portion electrically couples with the conducting terminal through a trace of the first surface of the circuit board.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
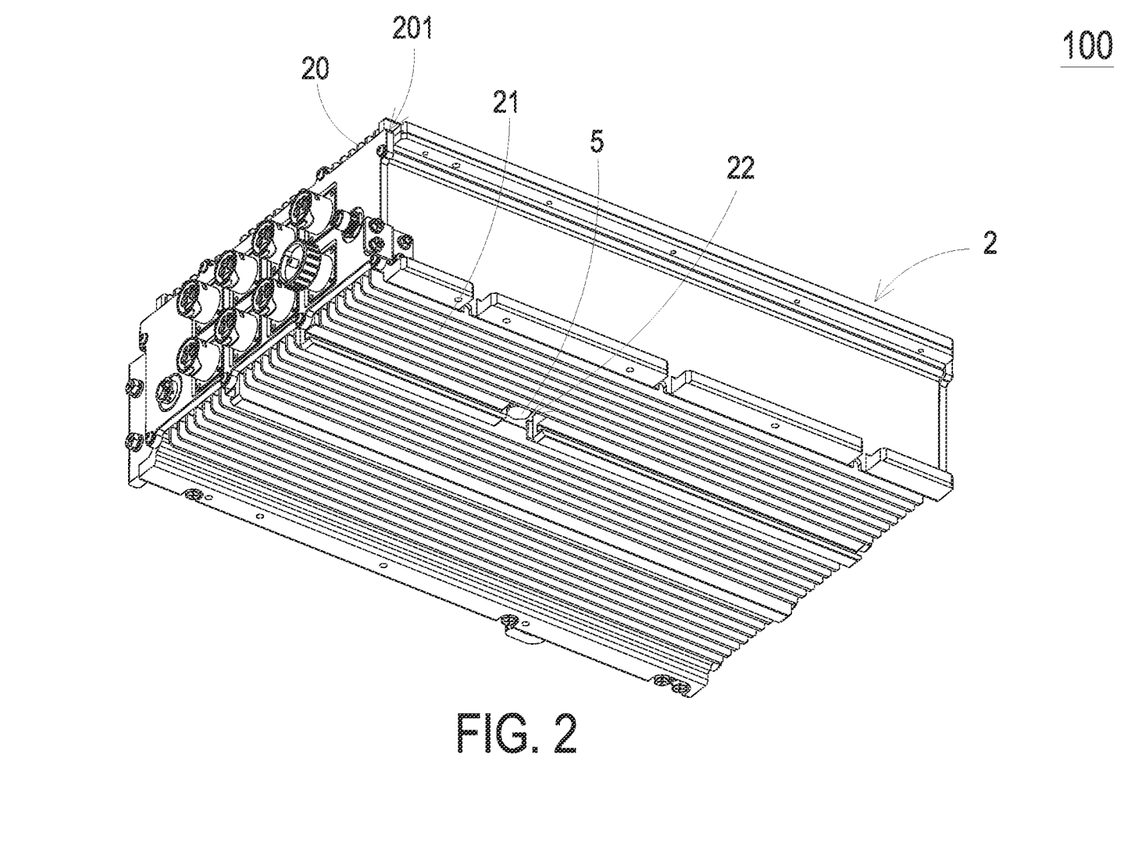
FIG. 2 is a schematic perspective view illustrating an electronic device according to an embodiment of the present disclosure.
Figure 3:
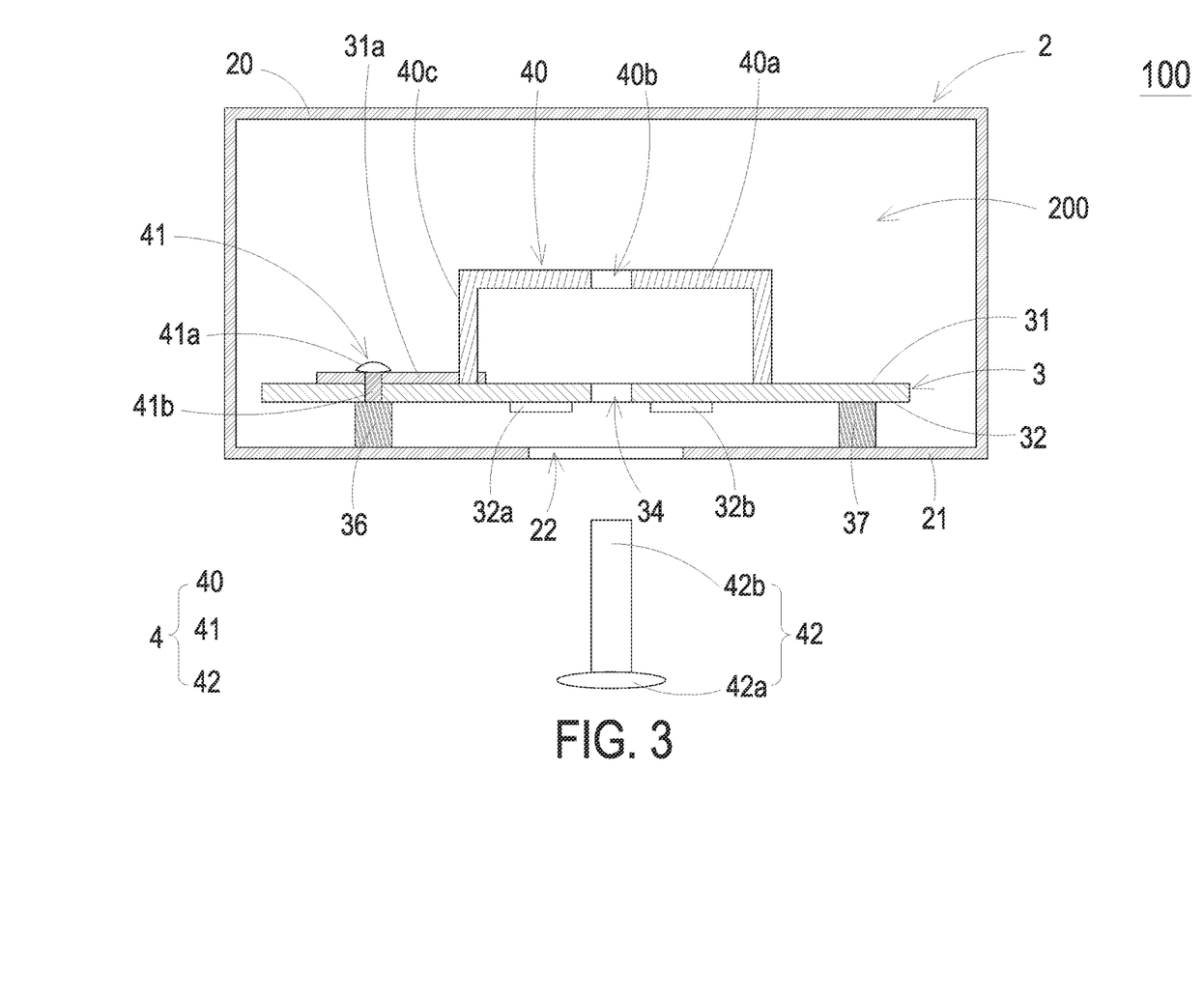
FIG. 3 is a schematic cross-sectional view illustrating the electronic device before a Hi-pot test.
Figure 4:
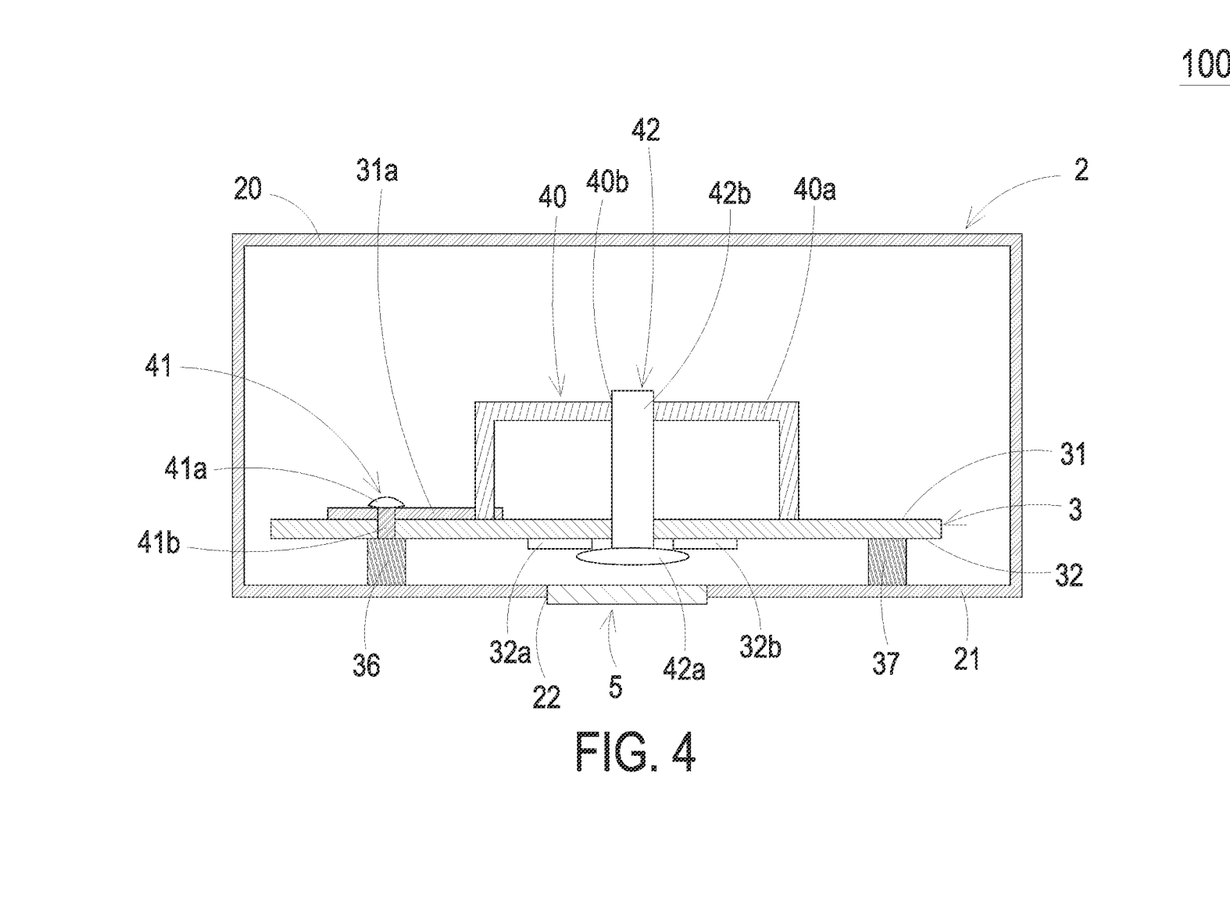
FIG. 4 is a schematic cross-sectional view illustrating the electronic device after a Hi-pot test.

FIG. 2 is a schematic perspective view illustrating an electronic device according to an embodiment of the present disclosure. FIG. 3 is a schematic cross-sectional view illustrating the electronic device before a Hi-pot test. FIG. 4 is a schematic cross-sectional view illustrating the electronic device after a Hi-pot test. As shown in FIGS. 2-4, the electronic device 100 of the embodiment includes a casing 2, a circuit board 3 and a grounding assembly 4. The casing 2 has a receiving space 200, and the circuit board 3 is disposed within the receiving space 200. The circuit board 3 has a first surface 31 and a second surface 32, and the first surface 31 is in correspondence with the second surface 32, wherein an input terminal 32a and an output terminal 32b are disposed on the second surface 32. The grounding assembly 4 includes a conducting terminal 40, a first grounding element 41 and a second grounding element 42, the conducting terminal 40 is disposed on the first surface 31 of the circuit board 3, and the first grounding element 41 is disposed adjacent to the conducting terminal 40. As shown in FIG. 4, the first grounding element 41 penetrates the circuit board 3, and electrically couples with the conducting terminal 40 and the casing 2. The second grounding element 42 correspondingly penetrates the circuit board 3 and the conducting element 40, so that a first portion 42a of the second grounding element 42 electrically couples with the input terminal 32a and the output terminal 32b of the circuit board 3, and a second portion 42b of the second grounding element 42 electrically couples with the conducting terminal 40.

Please refer to FIG. 2 and FIG. 3. In the embodiment, the electronic device 100 can be but not limited to be a closed power supply device. The electronic device 100 includes casing 2, casing 2 is a rectangle hollow structure, and has a receiving space 200 and an opening 201, wherein the receiving space 200 is for receiving the circuit board 3 and other electronic elements (not shown). The opening 201 is disposed on the top of the casing 2, and is in communication with the receiving space 200. As shown in FIG. 3, the casing 2 further has a cover 20. After the circuit board 3 and other electronic elements are disposed within the receiving space 200 through the opening 201 of the casing 2, the cover 20 is corresponding covered the opening 201, so as to complete the machine assembly. In addition, the casing has a bottom plate 21, and the bottom plate 21 has a first through hole 22. The first through hole 22 penetrates the bottom plate 21 and is in communication with the receiving space 200. After the Hi-pot test of the electronic device 100 is finished, a grounding protection procedure is conducted through the first through hole 22 of the bottom plate 21. Finally, when the grounding protection procedure is also finished, the valve 5 is sealed on the first through hole 22, and the internal pressure balance of the electronic device 100 is adjusted through the valve 5.

Please refer to FIG. 3. FIG. 3 illustrates a cross-sectional view of the electronic device 100 after covering the cover 20 and completing the machine assembly. As shown in FIG. 3, the circuit board 3 is disposed within the receiving space 200, and is fixed on the bottom plate 21 of the casing 2 through two fixing elements 36 and 37. In this embodiment, the fixing elements 36 and 37 can be but not limited to be studs. The fixing elements 36 and 37 are disposed on the second surface 32 of the circuit board 3, so as to support the circuit board 3. As shown in FIG. 3, the conducting terminal 40 and the first grounding element 41 are both disposed on the first surface 31 of the circuit board 3, and the first grounding element 41 is disposed adjacent to the conducting terminal 40.

Figure 5:
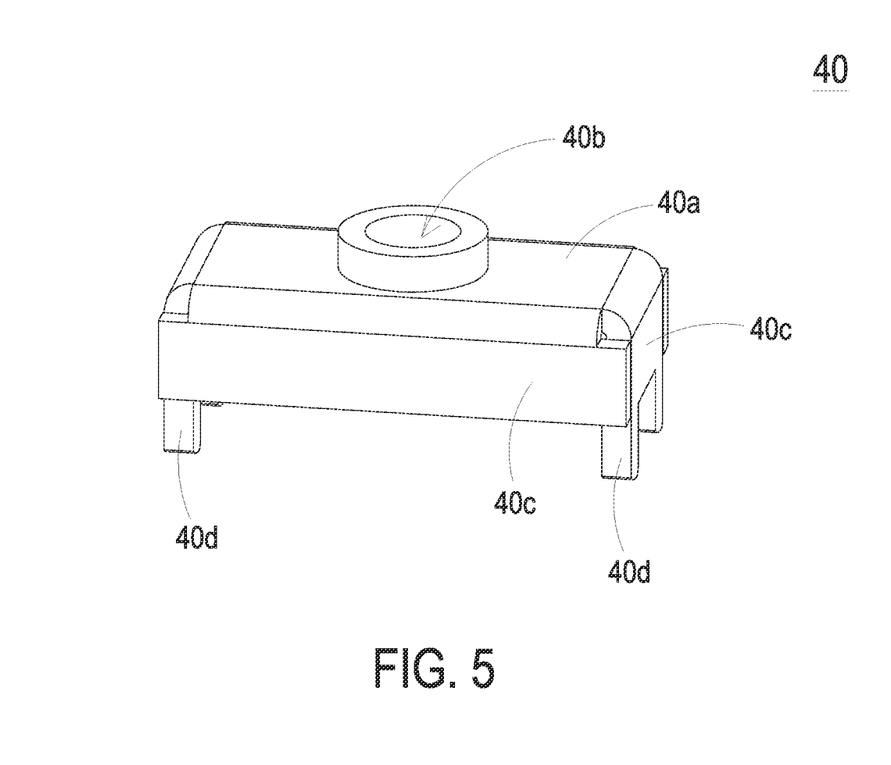
FIG. 5 is a schematic perspective view illustrating a conducting terminal of a grounding assembly of FIG. 3.

Please refer to FIG. 3 and FIG. 5. FIG. 5 is a schematic perspective view illustrating a conducting terminal of a grounding assembly of FIG. 3. As shown in FIG. 5, the conducting terminal 40 of the grounding assembly 4 is a rectangle hollow structure composed of a top surface 40a and four lateral surfaces 40c, but not limited thereto. The conducting terminal 40 is made of a conductive material, such as metallic material. In the embodiment, the conducting terminal 40 has a second through hole 40b. The second through hole 40b is for the second grounding element 42 to penetrate therein. In some embodiments, the second through hole 40b is disposed on the top surface 40a. As shown in FIG. 3, the position of the second through hole 40b is corresponding to the second hole 34 of the circuit board 3 and the first through hole 22 of the casing 2. As shown in FIG. 5, the conducting terminal 40 further comprises a plurality of legs 40d. In this embodiment, the number of the plurality of legs 40d is four, and the four legs 40d are extended downwardly from the conjunction of the two adjacent lateral surfaces 40c. When the conducting terminal 40 is disposed on the circuit board 3, the four legs 40d correspondingly penetrate the circuit board 3, so as to fix the conducting terminal 40 on the first surface 31 of the circuit board 3.

Please refer to FIG. 3 again. The first grounding element 41 of the grounding assembly 4 is disposed adjacent to the conducting terminal 40, and the first grounding element 41 penetrates the circuit board 3 downwardly, so as to lock on the fixing element 36 disposed under the circuit board 3. In this embodiment, the first grounding element 41 is made of a conductive material, such as metallic material. Moreover, the first grounding element 41 can be but not limited to be a screw. As shown in FIG. 3, the first grounding element 41 includes a third portion 41a and a fourth portion 41b. In this embodiment, the third portion 41a is the head of the screw, and the fourth portion 41b is the leg of the screw, but not limited thereto. When the first grounding element 41 penetrates the circuit board 3 downwardly and locks with the fixing element 36, an electrical conduction is achieved between the fourth portion 41b (the leg of the screw) and the bottom plate 21 of the casing 2 through a direct or indirect manner.

Figure 6:
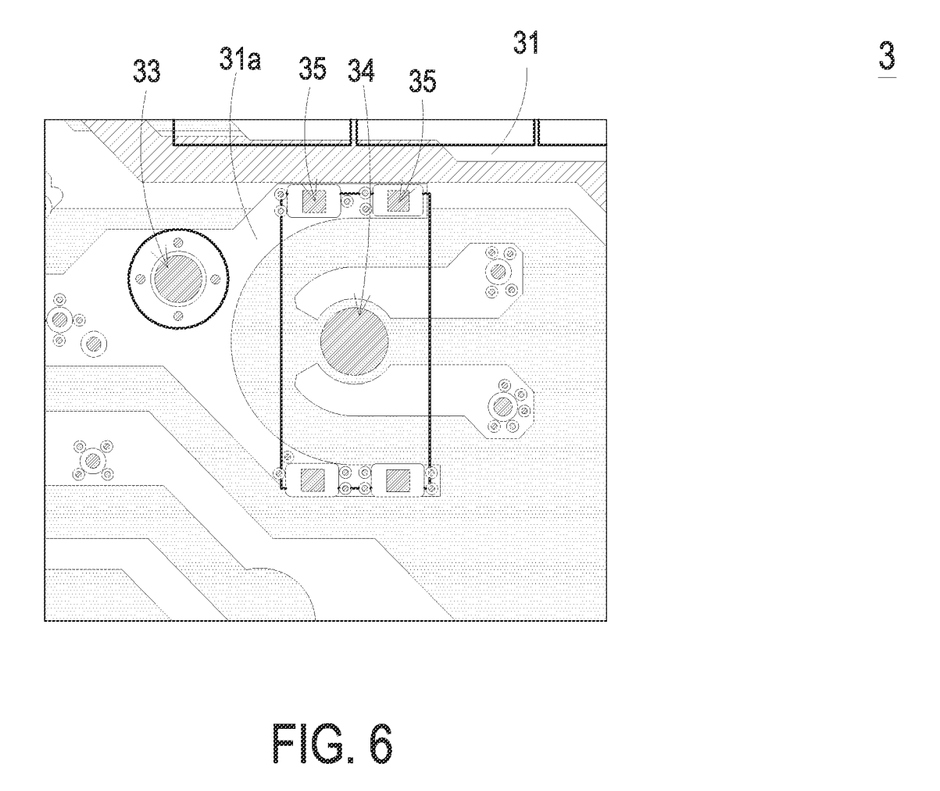
FIG. 6 is a partial enlargement schematic view illustrating a circuit board of FIG. 3.

Please refer to FIG. 3 and FIG. 6. FIG. 6 is a partial enlargement schematic view illustrating a circuit board of FIG. 3. As shown in FIG. 6, the circuit board 3 comprises a plurality of holes, such as a first hole 33, a second hole 34, a plurality of third holes 35, and so on. The position of the first hole 33 is in correspondence with the fixing element 36 under the circuit board 3 so as to allow the first grounding element 41 to penetrate through. The position of the second hole 34 is in correspondence with the first through hole 22 of the casing 2 and the second through hole 40b of the conducting terminal 40, so as to allow the second grounding element 42 to penetrate through. In this embodiment, the plurality of third holes 35 are square holes, but not limited thereto. The number and the positions of the plurality of third holes 35 are in correspondence with the plurality of legs 40d of the conducting terminals 40 (as shown in FIG. 5). As shown in FIG. 3 and FIG. 6, when the first grounding element 41 penetrates the circuit board 3 downwardly, it penetrates through the first hole 33 of the circuit board 3 and correspondingly locks with the fixing element 36. At this moment, the third portion 41a of the first grounding element 41 (the head of the screw) is disposed on the first surface 31 of the circuit board 3, and electrically couples with the conducting terminal 40 through a trace 31a of the first surface 31 of the circuit board 3. As shown in FIG. 6, the trace 31a connects with the first hole 33 and the third hole 35. In other words, when the conducting terminal 40 is disposed on the first surface 31 of the circuit board 3, it electrically couples with the third portion 41a of the first grounding element 41 through a trace 31a of the first surface 31 of the circuit board 3.

Figure 7:
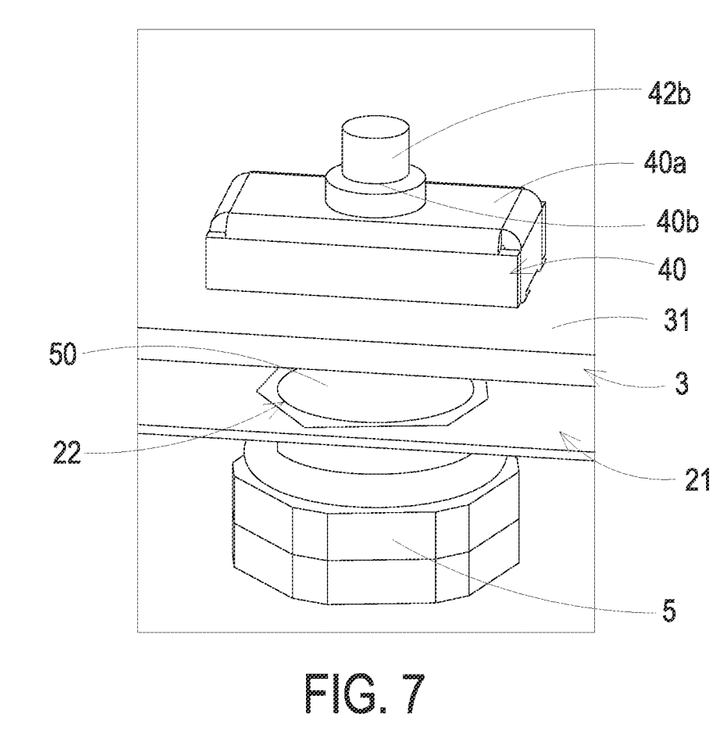
FIG. 7 is a schematic stereo view illustrating the conducting terminal, a first grounding element and a valve of the grounding assembly of FIG. 4.

Please refer to FIG. 3, FIG. 4 and FIG. 7. FIG. 7 is a schematic stereo view illustrating the conducting terminal, a first grounding element and a valve of the grounding assembly of FIG. 4. In the embodiment, the input terminal 32a and the output terminal 32b are disposed on the second surface 32 of the circuit board 3, and the input terminal 32a and the output terminal 32b do not couple with the first grounding element 41 directly. As shown in FIG. 3, the input terminal 32a and the output terminal 32b are disposed in the corresponding two sides of the second hole 34, and both of them are nearby the second hole 34. In some embodiments, the input terminal 32a and the output terminal 32b are primary side and secondary side, respectively, but not limited thereto. As previously mentioned, the machine assembly of the electronic device 100 is completed when the circuit board 3 and other electronic elements are disposed within the receiving space 200 and the cover 20 is corresponding covered the opening 201. In other words, after the covering procedure of the cover 20, the machine assembly of the electronic device 100 is finished, and the following Hi-pot test can be conducted. In the embodiment, the Hi-pot test includes a primary-side Hi-pot test and a secondary-side Hi-pot test, but not limited thereto. In order to make sure the accuracy of Hi-pot test, during the test, it have to remove the grounding, therefore, the grounding protection procedure of the embodiment is conducted after finishing the Hi-pot test. In particular, since machine assembly of the electronic device 100 is finished, the grounding protection procedure is conducted through the first through hole 22 of the bottom plate 21 of the casing 2 instead of opening the cover 20 of the electronic device 100. Consequently, the grounding protection procedure is conducted under the premise of considering the air tightness of the electronic device 100, which can be performed quickly and reliably without destroying the air tightness of the electronic device 100, and is benefit to the subsequent air tightness test of the electronic device 100.

As shown in FIG. 4. The grounding protection procedure is first to let the second grounding element 42 penetrate the first through hole 22 of the casing 2, then move upwardly to penetrate the second hole 34 of the circuit board 3. After that, the second grounding element 42 continues penetrate the second through hole 40b of the top surface 40a of the conducting terminal 40, and locks with the conducting terminal 40. In the embodiment, the second grounding element 42 is made of a conductive material, such as metallic material, and it can be but not limited to be a screw. In this embodiment, the second grounding element 42 includes a first portion 42a and a second portion 42b, wherein the first portion 42a is the head of the screw, and the second portion 42b is the leg of the screw, but not limited thereto. As shown in FIG. 4, when the second grounding element 42 penetrates the first through hole 22 of the casing 2 and the second hole 34 of the circuit board 3 upwardly, it locks on the second surface 32 of the circuit board 3. At this moment, the first portion 42a of the second grounding element 42 (the head of the screw) is disposed on the second surface 32 of the circuit board 3, and electrically couples with the input terminal 32a and the output terminal 32b of the second surface 32. Moreover, due to the second portion 42b of the second grounding element 42 (the leg of the screw) also penetrates the second through hole 40b of the top surface 40a of the conducting terminal 40 upwardly, the second portion 42b also locks with and electrically couples with the conducting terminal 40. Consequently, an electrical conduction is achieved among the input terminal 32a, the output terminal 32b and the conducting terminal 40 through the second grounding element 42. Meanwhile, the conducting terminal 40 also electrically couples with the casing 2 through the first grounding element 41. Consequently, the grounding protection procedure of the embodiment is performed quickly and effectively under the situation without open the cover 20 of the electronic device 100.

After the grounding protection procedure is finished, the valve 5, such as a exhausting valve, is sealed on the first through hole 22 of the bottom plate 21 of the casing 2, and the internal pressure balance of the electronic device 100 is adjusted through the valve 5, so as to ensure the safety and stability of the internal components. As shown in FIG. 7, the first surface 50 of the valve 5 completely seals the first through hole 22, and is coplanar with the bottom plate 21 of the casing 2. In some embodiments, the valve 5 is made of silicone or rubber, but the material is not limited to the above embodiments, and can be adjustable according the practical requirement. Consequently, the grounding assembly 4 and the grounding protection procedure of the embodiment benefit in simple structures, easy and fast assembly process, and saving production manpower and costs.

From the above descriptions, the present disclosure provides an electronic device and grounding assembly thereof. The grounding assembly includes a conducting terminal, a first grounding element and a second grounding element, wherein the conducting terminal and the first grounding element are first disposed on and electrically couple with the circuit board. After the circuit board and other electronic elements are disposed within the electronic device, and the Hi-pot test of the electronic device is also finished, the second grounding element sequentially penetrates through the first through hole of the casing, the circuit board and the conducting terminal, and locks on and electrically couples with the circuit board and the conducting terminal, so as to complete the grounding protection procedure. Consequently, the production and assembly process is more easy and fast, and under the premise of considering the air tightness of the electronic device, it can reach the efficacy of simple structures, easy and fast assembly, and easy conducting Hi-pot test and air tightness test. Namely, electronic device and grounding assembly thereof of the present disclosure are efficacy in saving assembly manpower and time, and the grounding protection procedure can be performed after machine assembly of the electronic device and Hi-pot test under the situation without open the cover of the electronic device, so as to ensure the safety and stability of the electronic device.

While the disclosure has been described in terms of what is presently considered to be the most practical and preferred embodiments, it is to be understood that the disclosure needs not be limited to the disclosed embodiment.

What is claimed is:
1. An electronic device, comprising:
   a casing having a receiving space;
   a circuit board disposing in the receiving space and having a first surface and a second surface, wherein an input terminal and an output terminal are disposed on the second surface;
   a valve; and
   a grounding assembly comprising a conducting terminal, a first grounding element and a second grounding element, wherein the conducting terminal is an integrated rectangular hollow structure composed of a top surface and four lateral surfaces and is disposed on the first surface of the circuit board, and the first grounding element is disposed adjacent to the conducting terminal and comprises a third portion;
   wherein the first grounding element penetrates the circuit board and electrically couples with the conducting terminal and the casing, wherein the third portion of the first grounding element electrically couples with a lateral surface of the conducting terminal through a trace of the first surface of the circuit board, and the second grounding element correspondingly penetrates the circuit board and a through hole of the top surface of the conducting terminal, so that a first portion of the second grounding element electrically couples with the input terminal and the output terminal of the circuit board, and a second portion of the second grounding element electrically couples with the conducting terminal;
   wherein the casing has a bottom plate, and the bottom plate has a first through hole, wherein the second grounding element penetrates the first through hole to lock with the circuit board;
   wherein the valve completely seals the first through hole of the bottom plate.

2. The electronic device according to claim 1, wherein the conducting terminal is a rectangle hollow structure and comprises a plurality of legs, the plurality of legs penetrate the circuit board, so as to fix the conducting terminal on the first surface of the circuit board.

3. The electronic device according to claim 1 further comprising a fixing element, wherein the fixing element is disposed under the second surface of the circuit board, when the first grounding element penetrates the circuit board, a fourth portion of first grounding element correspondingly is locked with the fixing element.

4. A grounding assembly utilized in an electronic device, the electronic device comprising a casing, a circuit board, and a valve, the grounding assembly comprising:
   a conducting terminal being an integrated rectangular hollow structure composed of a top surface and four lateral surfaces and disposed on a first surface of the circuit board;
   a first grounding element disposed adjacent to the conducting terminal and penetrating the circuit board and comprising a third portion, and electrically coupling with the conducting terminal and the casing, wherein the third portion electrically couples with a lateral surface of the conducting terminal through a trace of the first surface of the circuit board; and
   a second grounding element correspondingly penetrating the circuit board and a through hole of the top surface of the conducting terminal, wherein a first portion of the second grounding element electrically couples with an input terminal and an output terminal of the circuit board, and a second portion of the second grounding element electrically couples with the conducting terminal; and wherein the casing comprises a bottom plate, and the bottom plate has a first through hole, wherein the second grounding element penetrates the first through hole to lock with the circuit board;

wherein the valve completely seals the first through hole of the bottom plate.

5. The grounding assembly according to claim 4, wherein the conducting terminal comprises a second through hole for the second portion of the second grounding element to penetrate within.

6. The grounding assembly according to claim 4, wherein the conducting terminal is a rectangle hollow structure and comprises a plurality of legs, the plurality of legs penetrate the circuit board, so as to fix the conducting terminal on the first surface of the circuit board.

* * * * *